United States Patent
Hagl et al.

[19]

[11] Patent Number: 6,124,588
[45] Date of Patent: Sep. 26, 2000

[54] PROCESS AND MEASURING SYSTEM FOR LOCATING A MOVABLE OBJECT BY MONITORING THE ABSOLUTE POSITION OF THE OBJECT

[75] Inventors: Rainer Hagl, Altenmarkt; Steffen Bielski; Helmut Huber, both of Garching, all of Germany

[73] Assignee: Johannes Heidenhain GmbH, Traunreut, Germany

[21] Appl. No.: 09/029,808

[22] PCT Filed: Jul. 8, 1997

[86] PCT No.: PCT/EP97/03596

§ 371 Date: Jul. 2, 1998

§ 102(e) Date: Jul. 2, 1998

[87] PCT Pub. No.: WO98/01724

PCT Pub. Date: Jan. 15, 1998

[30] Foreign Application Priority Data

Jul. 10, 1996 [DE] Germany .......................... 196 27 670
Sep. 25, 1996 [DE] Germany .......................... 196 39 315

[51] Int. Cl.$^7$ .................................................. G01D 5/245
[52] U.S. Cl. ...................................... 250/231.14; 318/640
[58] Field of Search ........................ 250/231.13, 231.14, 250/231.16; 318/592, 594, 600–602, 604, 605, 640; 356/375

[56] References Cited

U.S. PATENT DOCUMENTS 5,686,804 11/1997 Siraky ...................................... 318/640

FOREIGN PATENT DOCUMENTS

| 24 16 212 | 11/1974 | Germany . |
| 43 42 377 A 1 | 6/1995 | Germany . |
| 195 13 692 C1 | 7/1996 | Germany . |

*Primary Examiner*—Stephone B. Allen
*Attorney, Agent, or Firm*—Brinks Hofer Gilson & Lione

[57] ABSTRACT

A method for position determination of a rotating drive element with the aid of a measuring system is indicated, which comprises an absolute and an incremental measuring subsystem. Here, following the start of a rotary movement, absolute position measurement values are continuously determined and transmitted to a subordinated evaluation unit until a reference marking at a known absolute position has been reached. A comparison of the measurement values, known from the continuing absolute position measurement, with the known absolute position and, if required, a necessary correction, take place at the reference marking. Thereafter the reference marking is used as the reference position for the incremental measuring subsystem, the continuously absolute position is determined on the part of the measuring system and is transmitted in digital form to the evaluation unit (FIG. 1).

26 Claims, 2 Drawing Sheets

PROCESS AND MEASURING SYSTEM FOR LOCATING A MOVABLE OBJECT BY MONITORING THE ABSOLUTE POSITION OF THE OBJECT

FIELD OF THE INVENTION

The instant invention relates to a method for position determination, particularly that of a rotating drive element. The invention further relates to a measuring system, which comprises an absolute and an incremental measuring subsystem.

BACKGROUND OF THE INVENTION

It is necessary for the precise control of an electrical drive to always detect the position of the revolving rotor with absolute accuracy and to know the absolute rotor position already at the start of a rotary movement, in particular in connection with synchronous motors. Various rotatory measuring systems are known for this, which transmit the detected measured position values over respectively several connecting lines to a subordinated evaluation unit, or respectively an electronic follow-up device. In turn, the evaluation unit takes over the drive control as well as further control function, if required. The least possible outlay in respect to the measuring systems used in this is desired.

However, relatively elaborate systems are the result of the employment of highly accurate absolute measuring systems, which possibly also provide incremental data, or of incremental measuring systems also providing absolute commutation signals and whose data are transferred to the evaluation unit. The parallel transmission of absolute and incremental position data, as well as of the reference marker signals, if required, requires a large number of connecting lines.

To reduce the number of required connecting lines between the respective measuring systems and the subordinated evaluation unit, the transmission of the measured values and other data by means of a multiplex operation over as few as possible signal connections is known, for example.

OBJECT AND SUMMARY OF THE INVENTION

It is the object of the instant invention to create a method for position determination, in particular for detecting revolving movement of a rotating drive element, as well as a measuring system suitable for this, which result in the smallest possible outlay. In this connection a reduced outlay in regard to the required signal transmission lines between the measuring system and the subordinated evaluation unit is particularly desired. Furthermore, a sufficiently precise and dependable position determination should be assured as soon as possible following the start of the rotating drive element.

The measuring system in accordance with the invention, or respectively the method in accordance with the invention, now provide the opportunity for detecting the absolute position of a rotating drive element at any point in time during the rotary movement. At the start of the rotary movement a control of the drive, i.e. particularly the required drive commutation, is already possible with sufficient precision on the basis of the position data transmitted to the evaluation unit. In this case the position data transmitted in digital form are based on the position data of the absolute measuring subsystem used, i.e. the resolution of the position data for the drive commutation transmitted at this point in time depends on the available resolution of the absolute measuring subsystem. As soon as a reference marker, whose absolute position is known, has been passed for the first time, a highly accurate absolute measured position value for the subsequent operation of the drive, or respectively its control, is available, together with the measured values of the incremental measuring subsystem, and is transmitted to the evaluation unit. In this connection there exist various options for producing the absolute relationship, i.e. in particular in view of the employment of one or several reference markers.

Further than that, the result is the desired reduction of the required connecting lines between the actual measuring system and the subordinated evaluation unit, since no parallel transmission of the position data of the absolute and the incremental measuring subsystems as well as the reference marker signals to the evaluation unit is necessary. The generation of absolute position data takes place with sufficient accuracy already on the part of the measuring system in connection with the various operational phases of the rotating drive element. The absolute position data are transmitted via a serial interface in digital form to the evaluation unit.

In addition, the method in accordance with the invention as well as the measuring system in accordance with the invention can be designed in such a way that a series of dependability-relevant monitoring steps are provided. For example, it is possible to transmit signals to the evaluation unit which distinguish the deviation of the position data determined with low resolution in the start-up phase from the actual position data.

It is furthermore possible to transmit signals to the evaluation unit even after the absolute reference has been established, which allow continuous monitoring of the absolute position data determined with greater accuracy, etc.

Further advantages as well as details of the method in accordance with the invention and the measuring system in accordance with the invention ensue from the subsequent description of an exemplary embodiment by means of the attached drawings.

DETAILED DESCRIPTION OF THE PREFERRED EMBODIMENT

Figure 1:
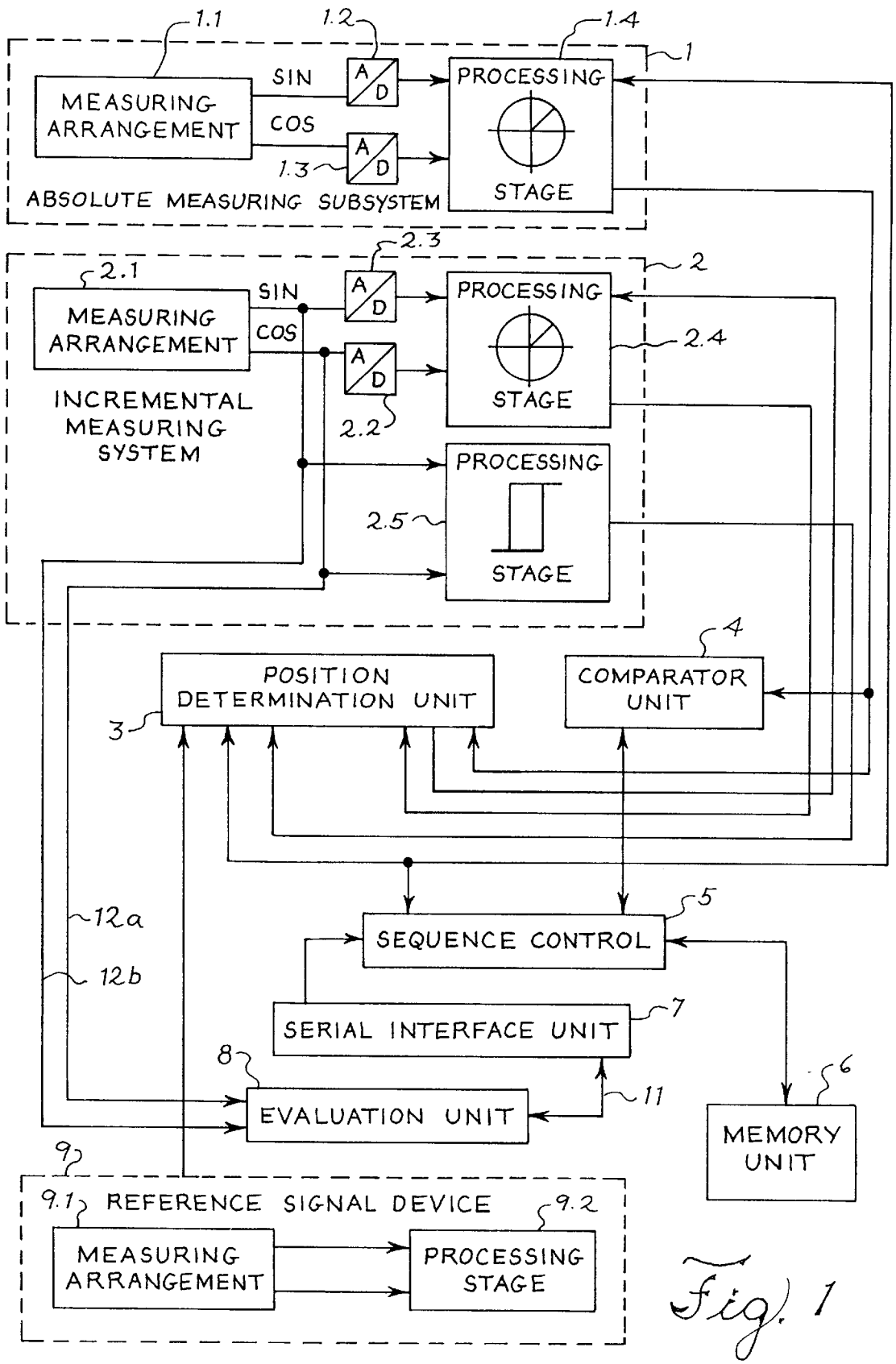
FIG. 1 shows a schematic representation of an exemplary embodiment of the measuring system in accordance with the invention.

The exemplary embodiment of the measuring system in accordance with the invention schematically represented in FIG. 1 comprises two measuring subsystems 1, 2, one of which is embodied as an incremental measuring subsystem 2, while the other is embodied as an absolute measuring subsystem 1, which allows the continuous detection of the absolute position of the rotating drive element, not represented. This will also be called a rotor hereinafter. In accordance with the invention, no highly precise absolute measuring system is required for this purpose, instead a measuring subsystem 1 is sufficient which, with one revolution of the rotating drive element, makes a rough absolute position determination possible. For example, an accuracy of the position determination to approximately 5° can be sufficient for this purpose, wherein the required accuracy of this measuring subsystem 1 depends on the respectively used drive. The measuring subsystem 1 must have at least a resolution which permits the commutation of the drive. In case of so-called block commutation it must therefore be assured that an absolute position determination within the three 120° segments of the rotary current field is possible.

An absolute measuring subsystem 1 suitable for this can be designed as a measuring system with a so-called commutation track, such as is known from drive angle encoders. This measuring subsystem 1 permits the determination of the absolute rotor position on the basis of a sine- and cosine-shaped scanning signal sin, cos. In this case the respective scanning signals sin, cos each have a signal period which corresponds to one revolution of the rotating drive element, so that an absolute position determination is unequivocally possible by means of one rotor revolution.

Sine-, or respectively cosine-shaped scanning signals sin, cos, which are digitized by means of A/D converter units 1.2, 1.3, are provided for further processing and the absolute position determination by means of a measuring subsystem 1 designed in this way. The formation of the absolute position measurement values subsequently takes place in a known manner in a further processing stage 1.4 of this measuring subsystem 1, for example by determining the arc tan from the two scanning signals sin, cos. For generating the sine-, or respectively cosine-shaped scanning signals sin, cos, in a possible embodiment the measuring arrangement 1.1 comprises among other things a scanning unit, by means of which a graduation track is photo-electrically scanned.

Depending on the desired or required accuracy, it is possible alternatively to the above to employ an absolute measuring subsystem 1, wherein the determination of the absolute position takes place, for example, on the basis of photo-electric scanning of one or several coded tracks, etc., i.e. the absolute measuring subsystem 1 can be designed in many different ways. It is only important for the selection of the absolute measuring subsystem 1 that the resolution of the respective absolute measuring subsystem 1 is at least sufficient for drive commutation.

The furthermore provided incremental measuring subsystem 2 is embodied in a known manner and provides position signals on the output side which correspond to incremental measuring steps. To this end, the sine- and cosine-shaped scanning signals sin, cos, which are generated for example by means of photo-electric scanning of a graduated disk in a measuring arrangement 2.1, are digitized by means of A/D converter units 2.2, 2.3 and are provided to a processing stage 2.4 of this measuring subsystem 2, in which an interpolation, or respectively division, of the incremental signals takes place. Therefore the incremental signals are divided into a predetermined number of measuring steps per signal period in this processing stage 2.4.

Incidentally, a selectable interpolation rate of the incremental measuring subsystem 2 within the measuring system in accordance with the invention can be provided by the user, the same as a definitely selectable setting of the resolution steps of the absolute measuring subsystem 1. In this way it is for example possible for the user to adapt a universally laid-out total system to various requirements in respect to drive configurations.

A further, second processing stage 2.5 is provided in the represented embodiment of the measuring system in accordance with the invention, which is assigned to the incremental measuring subsystem 2. A quadruple division of the signal period of the analog scanning signals sin, cos is possible by means of this processing stage 2.5, i.e. the rough position information is available through the processing stage 2.5 within one signal period of the incremental signals. It is thus possible, together with the interpolated signals of the other processing stage 2.4, to precisely determine the position of the rotating drive element within one signal period of the incremental signals.

To this end, the output signals of the two processing stages 2.4, 2.5 are respectively transmitted to a subordinated position determination unit 3 for further processing, whose function will be explained in more detail below.

In the embodiment of the device in accordance with the invention represented, two signal lines 12a, 12b can furthermore be seen, through which the analog incremental signals sin, cos of the incremental measuring subsystem 2 are further supplied directly to the subordinated evaluation unit 8. There the analog incremental signals sin, cos can be evaluated, for example for determining the velocity of the relative movement of two elements which can be moved toward each other. The transmission of the incremental signals furthermore has been shown to be advantageous in cases where a high degree of control dynamics is required on the part of the evaluation unit. However, in principle an additional transmission of the analog incremental signals is not required with the device in accordance with the invention.

The measuring system in accordance with the invention also comprises a device 9, only schematically indicated, for the generation of reference signals, or respectively reference pulses at reference markings arranged at known absolute positions. It is possible here to provide one or several reference markers over one revolution of the drive element, which respectively allow the unequivocal production of an absolute reference. Different possible variants for the arrangement of reference markers within one revolution of the rotating drive element will be described in more detail in what follows.

The device 9 for the generation of reference signals in this case comprises a measuring arrangement 9.1 which is suitable, for example, for photo-electric scanning of a reference graduation track. The output signals of the measuring arrangement 9.1 are supplied to a processing stage 9.2 which processes the signals in a form which permits their transmission to the position determination unit 3.

As already suggested above, the position-dependent signals of the incremental 2 and the absolute 1 measuring subsystems are in addition transmitted to the position determination unit 3. The output signals of the absolute measuring subsystem 1 as well as those of the position determination unit 3 are additionally switched through to a comparator unit 4. Regarding the functions of these components 3, 4 within the measuring system in accordance with the invention, as well as that of the also provided sequence control 5, the memory unit 6 and the serial interface unit 7, reference is made to the following description of an exemplary embodiment of the method in accordance with the invention.

Thus, at the start of the measurement, i.e. as soon as the rotor of the drive begins to rotate, the determination of an absolute position measurement value as the starting position takes place with the aid of the absolute measuring subsystem 1. Thereafter the absolute position of the rotor is determined in that the continuously generated measured values of the incremental measuring subsystem 2 are calculated by means of the detected absolute starting position. This customarily takes place by the addition of the incremental measuring steps to the known absolute starting position. These process steps take place with the aid of the position determination unit 3, which is supplied with the detected measured values of the incremental and absolute measuring subsystems 1, 2 for this purpose.

In this first rotation section, the absolute position of the rotor is dependent here on the accuracy of the determination of the absolute starting position, i.e. it depends on the accuracy of the absolute measuring subsystem 1. The absolute measuring subsystem makes an approximate absolute position determination possible with an accuracy of approximately 5°, which is sufficient for commutating the drive.

The absolute position measurement values of the rotating rotor, determined in this way in the position determination unit 3, are continuously passed on in digital form via the serial interface unit 7 and a suitable signal transmission line 11 to the subordinated evaluation unit 8, where further signal processing takes place.

The determination of the absolute position is performed in this way and with appropriate accuracy until a reference marking has been reached for the first time in the course of the rotor revolution, whose absolute position is exactly known, or respectively in case of distance-coded reference markings, until two reference markings have been passed. As soon as a corresponding reference marking signal has been transmitted to the position determination unit 3, the exact position of the rotor can be determined more accurately than during the first rotation section, i.e. more accurately than with the resolution of the absolute measuring subsystem. Starting at this time, the reference marking is used in the position determination unit 3 as the known absolute reference position for the incremental measuring subsystem 2, i.e. the incremental position data are calculated by means of the absolute reference position of the reference markings. Therefore, starting at this time the output of position data via the serial interface unit 7 to the evaluation unit 8 is equal to the knowledge of the exact absolute position of the rotor.

Various possibilities exist in regard to the provision of the correct absolute reference with the aid of reference markings. Thus, in the way described up to now, a single reference marking per revolution of the rotating drive element can be provided on the part of the measuring system. The absolute position of this single reference marking is known. Under the most unfavorable circumstances this can result in almost one complete revolution of the rotor being required until the correct absolute reference can be established.

In order to establish the desired exact absolute reference as quickly as possible, it can therefore be provided to arrange several reference markings per revolution. It is then only necessary to travel a fraction of the total revolution before the exact absolute reference is known. When utilizing several reference markings per revolution, various options also result.

Figure 4:
FIG. 4 schematically shows an embodiment of a reference graduation track to be used with the measuring system of FIG. 1 where a plurality of reference markings have defined and different distances with respect to each other.
Figure 4:

For example, in a first embodiment it is possible to use so-called distance-coded reference markings, such as are known from German Patent Publication DE 24 16 212, for example. In this case as schematically shown in FIG. 4 reference markings 32a–c arranged adjoining each other on a reference graduation track 31 have defined and different distances from each other. It is inherent that the reference markings 42a–c need to be arranged radially and equidistantly from a central point when a rotating drive element is part of the measuring system. By determining the respective distances, for example by counting the measurement steps of the incremental measuring subsystem 2, the unequivocal absolute reference can be quickly and definitely established after passing two reference markings, for which only a fraction of the revolution of the rotor is necessary.

Figure 3:
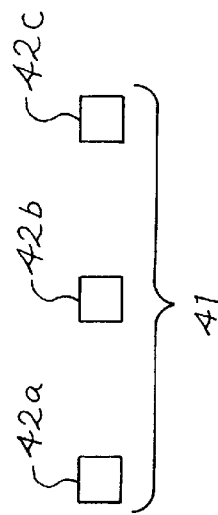
FIG. 3 schematically shows an embodiment of a reference graduation track to be used with the measuring system of FIG. 1 where a plurality of reference markings are equidistant from one another.

In a second embodiment of the measuring system in accordance with the invention with several reference markings per revolution, it is provided to arrange several reference markings 42a–c at the same distance from each other in a reference graduation track 41 as schematically shown in FIG. 3. It is inherent that the references markings 42a–c need to be arranged radially and equidistantly from a central point when a rotating drive element is part of the measuring system. In this embodiment, the association of a passed reference marking to a defined absolute position furthermore requires the simultaneous detection of a rough absolute signal. Such a rough absolute signal is available from the rough-resolving absolute measuring subsystem already mentioned. On the basis of the rough position information known after passage of a single reference marking, together with the known absolute position of the reference markings provided, the respective reference marking passed can be determined. This means in turn that the exact absolute reference has been established without a complete revolution of the rotor being required.

The described variants for establishing the absolute reference all can be used in connection with the measuring system in accordance with the invention.

When reaching the reference marking, or respectively when establishing the correct absolute reference, the absolute position measurement value so far determined is compared with the actual known absolute reference position of the reference marking, a possibly existing deviation is determined and the absolute position value corrected. The correction of the absolute position measurement value used up to that time at the reference marking can take place in various ways.

For example, in connection with a first possible embodiment, the known position value of the reference mark is used, starting with reaching the reference marking, as the absolute reference for the incremental signals. In this case it is possible to transmit to the evaluation unit, in addition to the absolute position data, also the detected difference, or respectively deviation, between the measured and actual absolute position at the reference marking. An appropriate difference signal is formed on the part of the measuring system with the aid of the comparator unit 4 to which, among other things, the absolute position data of the position determination unit 3 as well as the measured values of the absolute measuring subsystem 1 are provided. In case of a relatively large resultant difference signal, the position measurement values determined up to this time were therefore relatively inaccurate; a merely small difference signal indicates that the position measurement values detected up to this time were relatively exactly determined. It is then possible on the part of the evaluation unit to correct the commutation of the drive in steps over several scanning cycles with the aid of the transmitted difference signal. A jerky movement of the rotor when switching to the correct position determination is to be possibly avoided in this way.

In a further embodiment it can be provided to correct the absolute position measurement value in steps by means of the position determination unit 3 when the reference marking has been reached, or respectively when establishing the absolute reference and a detected deviation from the absolute position measured until then from the actual absolute position, and to transmit it to the evaluation unit 8. By means of this it is also possible to avoid a jerky movement of the drive at this time in case of possibly large deviations.

Starting with reaching for the first time one, or possibly several reference markings, the exact absolute position can be determined by the position determination unit 3 with the accuracy of the incremental measuring subsystem 2. The corresponding determination of the absolute position measurement values then takes place subsequently in the same way as in the previous rotation section by means of the position measurement unit 3, which calculates the position measurement values of the incremental measuring subsystem 2 on the basis of the known reference marking positions and continuously determines the absolute position measurement value in digital form. The transmission of the digital absolute position data to the evaluation unit 8 again takes place via the interface unit 7.

Alternatively to the described sequence of the individual method steps it is basically possible to omit the determination of a starting position at the beginning of the measurement and also the subsequent calculation of the incremental measurement signals together with this starting position. With such an embodiment of the method in accordance with the invention, the absolute position until the first passage of a reference marking is determined with the aid of the position determination unit 3 directly by means of the measured values of the absolute measuring subsystem 1. This then also takes place with only the accuracy of the relatively roughly resolving absolute measuring subsystem 1. Starting with the time of the first passage of the reference marking, the exact position of the rotor is determined in the manner described above, i.e. by calculating the position measurement values of the incremental measuring subsystem 2 by means of the known reference mark position. Starting with reaching the first reference marking, the absolute position determination can therefore also take place with the available accuracy of the incremental measuring subsystem 2.

In an advantageous embodiment of the method in accordance with the invention, or respectively the device in accordance with the invention, it is additionally provided to subsequently continue to determine the position of the rotor continuously by means of the absolute measuring subsystem 1 even after the first passage of the reference marking, or respectively the establishment of an exact absolute reference for the incremental measurement, and to transmit it to the comparator unit 4 provided. The comparator unit 4 furthermore also receives the output signals of the position determination unit 3, i.e. the absolute position measurement values generated after the establishment of the absolute reference. During the measuring process the difference between the position measurement values determined in different ways is continuously determined in the comparator unit 4 in order to monitor in this way the position measurement. Besides the absolute position data, the corresponding difference signal can be continuously transmitted by the measuring system to the evaluation unit 8 via the serial interface unit 7. In this way it is possible for the evaluation unit 8 to perform continuous monitoring of the highly accurate absolute position data. The redundant design makes it possible to do without additional further backup devices.

A further, or respectively additional, possibility for monitoring the absolute position determination on the part of the evaluation unit 8 consists in detecting the incremental measuring steps determined between successive reference markings and in comparing them with the known required number of such measuring steps.

Thus, by means of the sketched monitoring or comparing operations it is assured, depending on the requirements made on dependability, that a quick reaction can take place in case of a possible error, for example in the form of an EMERGENCY-OUT command of the evaluation unit to the drive, etc.

As already indicated above, a transmission of the digital absolute position data always takes place via the serial interface unit 7 to the subordinated evaluation unit 8. While in the course of determining the absolute position the resolution of the absolute measuring subsystem 1 is available up to the time a reference marking is passed for the first time, it is possible, following the establishment of the exact absolute reference, to make use of the greater accuracy, or respectively resolution, of the incremental measuring subsystem 2. No parallel transmission of the position-related data from the absolute and the incremental measuring subsystems, as well as of the reference marking signals, is required, i.e. a corresponding savings in connecting lines between the measuring system and the evaluation unit 8 results.

Figure 2:
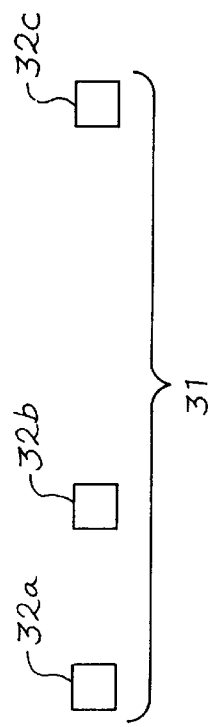
FIG. 2 is a representation of an exemplary embodiment of data blocks transmitted to the evaluation unit.

Here, the data transmission between the measuring system and the evaluation unit 8 preferably is performed in blocks, wherein different data blocks are provided for the absolute position data, the difference signals formed from the position measurements of the two measuring subsystems 1, 2, and further values of interest to the evaluation unit 8. FIG. 2 represents how the serial transmission of such data blocks can possibly be organized.

A first data block POS of 9 bits is provided, by means of which the absolute position information is transmitted in digital form. A further data block STAT with four bits contains the coded information whether a reference marker had already been passed. The information, by means of which resolution of the actually transmitted position data had been generated, is available at the evaluation side with this. In addition, a third data block DIF with eight bits is provided, through which a difference signal, which had been generated on the part of the measuring system as explained above, is transmitted in digital form from the measuring system to the evaluation unit 8.

The entire sequence described is synchronized, or respectively controlled, via the sequence control S. To this end it is possible to provide, for example, a CPU or a hard-wired circuit, which is assigned to the measuring system.

In addition, the measuring system in accordance with the invention comprises a write-in/read-out memory unit 6, in which parameters specific to the measuring system can be stored. For example, these parameters can be transmitted to the evaluation unit 8 at the start of measuring and used during the evaluation, etc. Regarding further details, reference is made in this connection to German Patent Publication DE 43 42 377, for example.

It is of course possible to alter the described exemplary embodiment of the instant invention in many ways in order to adapt it, if required, to modified measuring demands. For example, it is possible to expand the described measuring system into a multi-turn measuring system by additionally providing suitable means for detecting the revolutions of the rotating shaft of the rotor, etc.

What is claimed is:

1. A method for position determination of a rotating drive element with the aid of a measuring system comprising an absolute and an incremental measuring subsystem, wherein following the beginning of measurements, the absolute position measurement value of the rotating driving element is determined, wherein the absolute position measurement values determined in this way are continuously transmitted in digital form to a subordinated evaluation unit until a reference marking at a known absolute reference position has been reached, wherein the absolute position measurement values are prepared for allowing a serial transmission, subsequently the actually determined absolute position measurement value is compared with the known absolute reference position and, in case of nonconformity, is at least partially corrected, and thereafter the actually determined absolute position measurement values are continuously formed by calculating the data of the incremental measuring subsystem by the known absolute reference positions, and are transmitted as an output signal in digital form to the subordinated evaluation unit.

2. The method in accordance with claim 1, wherein the absolute position measurement values, following the beginning of measurements and until a reference mark has been reached, are formed by combining the position measurement values of the incremental measuring subsystem with an absolute position measurement value determined by the absolute measuring subsystem.

3. The method in accordance with claim 1, wherein the absolute position measurement values following the beginning of measurements and until a reference mark has been reached are formed by the absolute measuring subsystem.

4. The method in accordance with claim 1, wherein the determination of the absolute position by the absolute measuring subsystem takes place with the aid of sine- or cosine-shaped scanning signals, which have a period length corresponding to one revolution of the rotating drive element.

5. The method in accordance with claim 1, wherein the determination of the absolute position by the absolute measuring subsystem takes place on the basis of scanning one or several coded tracks.

6. A method for position determination of a rotating drive element with the aid of a measuring system comprising an absolute and an incremental measuring subsystem, the method comprising:

following the beginning of measurements, the absolute position measurement value of the rotating drive element is determined, wherein the absolute position measurement values determined in this way are continuously transmitted in digital form to a subordinated evaluation unit until a reference marking at a known absolute reference position has been reached, subsequently the actually determined absolute position measurement value is compared with the known absolute reference position and in case of nonconformity is at least partially corrected, and thereafter;

the actually determined absolute position measurement values are continuously formed by calculating the data of the incremental measuring subsystem by the known absolute reference positions, and are transmitted as an output signal in digital form to the subordinated evaluation unit; and wherein, following a first passage of the reference marking, a difference signal in respect to the difference between the known absolute reference position and the actually determined absolute position measurement value is formed from the two measuring subsystems.

7. The method in accordance with claim 6, wherein, besides the absolute position measurement value, the formed difference signal is also transmitted in digital form to the subordinated evaluation unit.

8. The method in accordance with claim 7, wherein a serial data transfer in blocks takes place between the measuring system and the subordinated evaluation unit.

9. The method in accordance with claim 8, wherein individual data blocks for the position measurement values and for the difference signals are transmitted to the subordinated evaluation unit.

10. The method in accordance with claim 9, wherein furthermore data blocks regarding the status of the absolute and/or the incremental measuring subsystem are transmitted to the subordinated evaluation unit.

11. The method in accordance with claim 10, wherein one data block contains information as to whether a reference marking has already been passed.

12. The method in accordance with claim 6, wherein all method steps in connection with the position determination and the difference signal formation take place on the part of the measuring system, and both the absolute position measurement values and the difference signal are serially transmitted to the subordinated evaluation unit.

13. The method in accordance with claim 6, wherein following the first determination of an absolute position measurement value, the absolute position measurement values of the rotating drive element is also continued to be continuously determined by the absolute measuring subsystem with the aid of the incremental measuring subsystem.

14. The method in accordance with claim 13, wherein the absolute position measurement values determined with the aid of the absolute measuring subsystem are continuously compared with absolute position measurement values which were determined with the aid of the incremental measuring subsystem, and a further difference signal regarding an actual difference between the absolute position measurement values determined by the absolute and incremental measuring subsystems is formed.

15. A method for position determination of a rotating drive element with the aid of a measuring system comprising an absolute and an incremental measuring subsystem, the method comprising:

following the beginning of measurements, the absolute position measurement value of the rotating drive element is determined, wherein the absolute position measurement values determined in this way are continuously transmitted in digital form to a subordinated evaluation unit until a reference marking at a known absolute reference position has been reached, subsequently the actually determined absolute position measurement value is compared with the known absolute reference position and, in case of nonconformity, is at least partially corrected, and thereafter;

the actually determined absolute position measurement values are continuously formed by calculating the data of the incremental measuring subsystem by the known absolute reference positions, and are transmitted as an output signal in digital form to the subordinated evaluation unit; and wherein a check of the incremental measuring subsystem takes place in that the number of incremental measurement steps between the passage of two reference markings is detected and compared with the known number of increments which must lie in an area between the two reference markings.

16. A method for position determination of a rotating drive element with the aid of a measuring system comprising an absolute and an incremental measuring subsystem, the method comprising:

following the beginning of measurements the absolute position measurement value of the rotating drive element is determined, wherein the absolute position measurement values determined in this way are continuously transmitted in digital form to a subordinated evaluation unit until a reference marking at a known absolute reference position has been reached, subsequently the actually determined absolute position measurement value is compared with the known absolute reference position and, in case of nonconformity is at least partially corrected, and thereafter;

the actually determined absolute position measurement values are continuously formed by calculating the data of the incremental measuring subsystem by the known absolute reference positions, and are transmitted as an output signal in digital form to the subordinated evaluation unit; and wherein several reference markings of defined and different distances from each other are employed for establishing an exact absolute reference.

17. A method for position determination of a rotating drive element with the aid of a measuring system comprising an absolute and an incremental measuring subsystem, the method comprising following the beginning of measurements, the absolute position measurement value of the rotating drive element is determined, wherein the absolute position measurement values determined in this way are continuously transmitted in digital form to a subordinated evaluation unit until a reference marking at a known absolute reference position has been reached, subsequently the actually determined absolute position measurement value is compared with the known absolute reference position and in case of nonconformity, is at least partially corrected, and thereafter;

the actually determined absolute position measurement values are continuously formed by calculating the data of the incremental measuring subsystem by the known absolute reference positions and are transmitted as an output signal in digital form to the subordinated evaluation unit; and wherein several equidistant reference markings are used in connection with the continuously formed actually determined absolute position measurement values of the absolute measuring subsystem for establishing an exact absolute reference.

18. A measuring system for position determination comprising:

a rotating drive element;

an absolute measuring subsystem;

an incremental measuring subsystem;

a signal generation device that generates reference signals at reference markings of a known absolute position, a position determination unit in which, on the basis of measurement values of the incremental measuring subsystem together with measurement values of the absolute measuring subsystem and/or measurement values of the signal generation device for the generation of reference signals, a signal representative of the absolute position of the rotating drive element can be continuously determined, wherein the signal representative of the determined absolute position is prepared for allowing a serial transmission, an interface unit, which transfers output signals of the position determination unit in serial form to a subordinated evaluation unit.

19. The measuring system in accordance with claim 18, wherein the absolute measuring subsystem is designed in such a way that the determination of the absolute position is performed on the basis of sine- or cosine-shaped scanning signals having a period length corresponding to one revolution of the rotating drive element.

20. The measuring system in accordance with claim 18, wherein the determination of the absolute position is performed on the basis of scanning one or several coded tracks.

21. The measuring system in accordance with claim 18, wherein furthermore a sequence control is arranged on the part of the measuring system, which controls the data transfer within the measuring system as well as between the measuring system and the subordinated evaluation unit.

22. The measuring system in accordance with claim 18, wherein a write-in/read-out memory unit for measuring system- specific parameters is arranged on the part of the measuring system.

23. A measuring system for position determination comprising:

a rotating drive element;

an absolute measuring subsystem;

an incremental measuring subsystem;

a signal generation device that generates reference signals at reference markings of a known absolute position, a position determination unit in which on the basis of measurement values of the incremental measuring subsystem together with measurement values of the absolute measuring subsystem and/or measurement values of the signal generation device for the generation of reference signals the absolute position of the rotating drive element can be continuously determined, wherein the determined absolute position is available in digital form at an output of the measuring system;

an interface unit, which transfers output signals of the position determination unit in serial form to a subordinated evaluation unit; and wherein furthermore a comparator unit is arranged on the part of the measuring system, to which the measurement values of the absolute measuring subsystem, as well as the absolute position determined by the position determination unit are supplied.

24. The measuring system in accordance with claim 23, wherein a difference signal regarding a possible difference between the position determined by the absolute and incremental measuring subsystems and the actual position can be generated by the comparator unit.

25. A measuring system for position determination comprising:

a rotating drive element;

an absolute measuring subsystem;

an incremental measuring subsystem;

a signal generation device that generates reference signals at reference markings of a known absolute position, a position determination unit in which on the basis of measurement values of the incremental measuring subsystem together with measurement values of the absolute measuring subsystem and/or measurement values of the signal generation device for the generation of reference signals, the absolute position of the rotating drive element can be continuously determined, wherein the determined absolute position is available in digital form at an output of the measuring system;

an interface unit, which transfers output signals of the position determination unit in serial form to a subordinated evaluation unit; and wherein the signal generating device comprises several reference markings with defined and different distances between them for establishing an exact absolute reference.

26. A measuring system for position determination comprising:

a rotating drive element;

an absolute measuring subsystem;

an incremental measuring subsystem;

a signal generation device that generates reference signals at reference markings of a known absolute position, a position determination unit in which, on the basis of measurement values of the incremental measuring subsystem together with measurement values of the absolute measuring subsystem and/or measurement values of the signal generation device for the generation of reference signals the absolute position of the rotating drive element can be continuously determined, wherein the determined absolute position is available in digital form at an output of the measuring system;

an interface unit, which transfers output signals of the position determination unit in serial form to a subordinated evaluation unit; and wherein the signal generating device comprises several equidistant reference markings which can be evaluated, together with the continuously detected position measurement values of the absolute measuring subsystem.

* * * * *

UNITED STATES PATENT AND TRADEMARK OFFICE
CERTIFICATE OF CORRECTION

PATENT NO.    : 6,124,588
DATED         : September 26, 2000
INVENTOR(S)   : Rainer Hagl et al.

It is certified that error appears in the above-identified patent and that said Letters Patent is hereby corrected as shown below:

Title page,
Column 1,
Item [73], insert -- Dr. -- before "Johannes".
Line 4, under "FOREIGN PATENT DOCUMENTS", insert the following:

-- OTHER PUBLICATIONS
Peter Polak, "Drehgeber oder Resolver?" 12 December, 1995 ELECTRONIK 25/1995, pp. 60-64. --

Claims,
Claim 6,
Line 15, change "and in case of nonconformity is" to -- and, in case of nonconformity, is --.

Claim 16,
Line 5, insert -- , -- after "measurements".

Claim 17,
Line 4, insert -- : -- after "comprising".
Line 15, insert -- , -- after "and".
Line 20, insert -- , -- after "positions".

Claim 18,
Line 4, change "subsystem;" to -- subsystem: --.

Claim 23,
Line 8, insert -- , -- after "which".
Line 13, insert -- , -- after "signals".

UNITED STATES PATENT AND TRADEMARK OFFICE
CERTIFICATE OF CORRECTION

PATENT NO. : 6,124,588
DATED : September 26, 2000
INVENTOR(S) : Rainer Hagl et al.

It is certified that error appears in the above-identified patent and that said Letters Patent is hereby corrected as shown below:

Claim 25,
Line 8, insert -- , -- after "which".

Claim 26,
Line 13, insert -- , -- after "signals".

Signed and Sealed this

Sixth Day of November, 2001

Attest:

*Nicholas P. Godici*

NICHOLAS P. GODICI
*Attesting Officer*    *Acting Director of the United States Patent and Trademark Office*